United States Patent
Zhang et al.

(10) Patent No.: US 9,318,623 B2
(45) Date of Patent: Apr. 19, 2016

(54) RECESSED TERMINATION STRUCTURES AND METHODS OF FABRICATING ELECTRONIC DEVICES INCLUDING RECESSED TERMINATION STRUCTURES

(75) Inventors: Qingchun Zhang, Cary, NC (US); Jason Henning, Carborro, NC (US)

(73) Assignee: Cree, Inc., Durham, NC (US)

(*) Notice: Subject to any disclaimer, the term of this patent is extended or adjusted under 35 U.S.C. 154(b) by 451 days.

(21) Appl. No.: 13/080,126

(22) Filed: Apr. 5, 2011

(65) Prior Publication Data

US 2012/0256192 A1 Oct. 11, 2012

(51) Int. Cl.
H01L 29/872 (2006.01)
H01L 29/06 (2006.01)
H01L 29/66 (2006.01)
H01L 29/16 (2006.01)

(52) U.S. Cl.
CPC .......... *H01L 29/872* (2013.01); *H01L 29/0619* (2013.01); *H01L 29/0661* (2013.01); *H01L 29/1608* (2013.01); *H01L 29/6606* (2013.01); *H01L 29/66143* (2013.01)

(58) Field of Classification Search
CPC .............. H01L 29/872; H01L 29/0619; H01L 29/66143
USPC .................................................. 257/109, 484
See application file for complete search history.

(56) References Cited

U.S. PATENT DOCUMENTS

| | | | |
|---|---|---|---|
| 4,242,690 A | 12/1980 | Temple | |
| 4,927,772 A | 5/1990 | Arthur et al. | |
| 5,726,469 A | 3/1998 | Chen | |
| 5,914,500 A | 6/1999 | Bakowsky et al. | |
| 5,977,605 A | 11/1999 | Bakowsky et al. | |
| 6,083,814 A | 7/2000 | Nilsson | |
| 6,696,705 B1 | 2/2004 | Barthelmess et al. | |
| 7,026,650 B2 | 4/2006 | Ryu et al. | |
| 7,304,363 B1 | 12/2007 | Shah | |
| 7,649,213 B2 | 1/2010 | Hatakeyama et al. | |
| 7,838,377 B2* | 11/2010 | Zhang et al. ........... | 438/343 |
| 2004/0135153 A1 | 7/2004 | Ryu et al. | |
| 2005/0202661 A1 | 9/2005 | Ceruzzi et al. | |
| 2006/0118792 A1 | 6/2006 | Ryu et al. | |
| 2007/0120148 A1 | 5/2007 | Nogome | |

(Continued)

FOREIGN PATENT DOCUMENTS

EP 0 176 778 A2 4/1986
EP 0 389 863 A1 10/1990

(Continued)

OTHER PUBLICATIONS

Onose et al, "Over 2000 V FLR Termination Technologies for SiC High Voltage Devices" 12th International Symposium on Power Semiconductor Devices and IC's, Toulouse, France (2000), pp. 245-248.*

(Continued)

*Primary Examiner* — Phat X Cao
(74) *Attorney, Agent, or Firm* — Myers Bigel & Sibley, P.A.

(57) ABSTRACT

An electronic device includes a drift region, a Schottky contact on a surface of the drift region, and an edge termination structure in the drift region adjacent the Schottky contact. The edge termination structure includes a recessed region that is recessed from the surface of the drift region by a distance d that may be about 0.5 microns.

23 Claims, 9 Drawing Sheets

(56) References Cited

U.S. PATENT DOCUMENTS

| | | | |
|---|---|---|---|
| 2007/0241427 A1 | 10/2007 | Mochizuki et al. | |
| 2008/0006848 A1 | 1/2008 | Chen et al. | |
| 2008/0246085 A1 | 10/2008 | Saito et al. | |
| 2008/0251793 A1 | 10/2008 | Mazzola et al. | |
| 2010/0140697 A1 | 6/2010 | Yedinak et al. | |
| 2010/0289032 A1 | 11/2010 | Zhang et al. | |
| 2011/0001189 A1 | 1/2011 | Challa et al. | |
| 2011/0227152 A1* | 9/2011 | Hsu et al. | 257/334 |

FOREIGN PATENT DOCUMENTS

| | | |
|---|---|---|
| EP | 1 806 787 A1 | 7/2007 |
| EP | 2 244 297 A1 | 10/2010 |
| JP | 3-225870 | 10/1991 |
| JP | 2006516815 A | 7/2006 |
| JP | 2009-177028 | 8/2009 |
| KR | 20090088620 A | 8/2009 |
| KR | 20120022398 A | 3/2012 |
| WO | WO 96/03774 | 2/1996 |
| WO | WO 97/08754 A2 | 3/1997 |
| WO | WO 97/08754 A3 | 6/1997 |
| WO | WO 98/02924 A2 | 1/1998 |
| WO | WO 98/32178 A1 | 7/1998 |
| WO | WO 2006/122252 A2 | 11/2006 |
| WO | WO 2006/135031 A2 | 12/2006 |
| WO | WO 2006/135031 A3 | 12/2006 |
| WO | WO 2007/040710 A1 | 4/2007 |
| WO | WO 2007/143008 A2 | 12/2007 |
| WO | WO 2009/061340 A1 | 5/2009 |

OTHER PUBLICATIONS

International Search Report Corresponding to International Application No. PCT/US12/32078; Date of Mailing: Jul. 20, 2012; 16 Pages.
Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.
European Search Report for corresponding EP patent application No. 09163424.6 dated Apr. 9, 2010.
International Search Report and Written Opinion (13 pages) corresponding to International Application No. PCT/US2008/010538; Mailing Date: Dec. 22, 2008.
International Search Report and Written Opinion, International Application No. PCT/US2009/000734, Apr. 23, 2009.
Katsunori Ueno, Tatsue Urushidani, Kouichi Hahimoto, and Yasukazu Seki. "The Guard-Ring Termination for the High-Voltage SiC Schottky Barrier Diodes." *IEEE Electron Device Letters.* vol. 16. No. 7, Jul. 1995.
Kinoshita et al., "Guard Ring Assisted RESURF: A New Termination Structure Providing Stable and High Breakdown Voltage for SiC Power Devices," Tech. Digest of ISPSD '02, pp. 253-256.

Losee et al., "High Voltage 4H-SiC PiN rectifiers with single-implant, multi-zone JTE termination", Power Semiconductor Devices and ICS, 2004; Proceedings ISPSD 2004; The 16th International Symposium on Kitakyushu Int. Conf. Ctr. Japan, May 24-27, 2004; Piscataway, NJ, USA, IEEE, May 24, 2004, pp. 301-304, XP010723398.
Notification of Transmittal of the International Search Report and the Written Opinion of the International Searching Authority, or the Declaration; International Search Report; Written Opinion of the International Searching Authority—Corresponding to International Application No. PCT/US2010/026632; Date of Mailing: Oct. 8, 2010; 16 pages.
Singh, R. and J.W. Palmour, "Planar Terminations in 4H-SiC Schottky Diodes with Low Leakage and High Yields," *IEEE International Symposium on Power Semiconductor Devices and ICs*, 1997.
Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.
Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.
Sundaresan et al., "Ultra-low resistivity Al+ implanted 4H-SiC obtained by microwave annealing and a protective graphite cap", *Solid-State Electronics* vol. 52, 2008, pp. 140-145, XP022360431.
Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.
Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.
Notification Concerning Transmittal of International Preliminary Report on Patentability, Corresponding to International Application No. PCT/US2012/032078;, Date of Mailing Oct. 17, 2013, 9 pages.
Streetman, B, *Solid State Electronic Devices*, 2nd Ed., 1980, pp. 164-166.
Extended European Search Report corresponding to European Application No. 12768596.4; Date of Mailing Sep. 11, 2014 (8 pages).
Onose et al. "Over 2000 V FLR Termination Technologies for SiC High Voltage Devices" 12th International Symposium on Power Semiconductor Devices and IC's, Toulose, France (2000), pp. 245-248.
Office Action (Notification of Reasons for Rejection) for corresponding Japanese Patent Application No. 2014-503928, date of mailing: Dec. 15, 2014 (5 pages, including English translation).
Office Action (Preliminary Rejection) for corresponding Korean Patent Application No. 10-2013-7027947, date of mailing: Dec. 10. 2015 (13 pages, including English transiatiorl).

* cited by examiner

RECESSED TERMINATION STRUCTURES AND METHODS OF FABRICATING ELECTRONIC DEVICES INCLUDING RECESSED TERMINATION STRUCTURES

FIELD

The present invention relates to microelectronic devices, and more particularly to edge terminations for microelectronic devices.

BACKGROUND

High voltage silicon carbide (SiC) devices can be capable of handling high voltages, and may handle as much as about 100 amps or more of current, depending on the size of their active area. High voltage SiC devices have a number of important applications, particularly in the field of power conditioning, distribution and control.

A conventional power device structure has an n-type SiC substrate on which an n– epitaxial layer, which functions as a drift region, is formed. The device typically includes a P-N and/or Schottky junction on the n-layer, which acts as a main junction for blocking voltage in the reverse bias direction and providing current flow in the forward bias direction. A p-type junction termination extension (JTE) region, which is typically formed by ion implantation, may surround the main junction. The implants used to form the JTE region may be aluminum, boron, or any other suitable p-type dopant. The purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants, such as nitrogen or phosphorus, in order to prevent/reduce extension of the depletion region to the edge of the device.

In addition to junction termination extension (JTE), multiple floating guard rings (MFGR) and field plates (FP) are commonly used termination schemes in high voltage silicon carbide devices. Another conventional edge termination technique is a mesa edge termination.

Field plate termination is also a conventional technique for edge termination of a device and may be cost-effective. In conventional field plate devices, high fields are supported by the oxide layer under the metal field plate. This technique performs well for silicon devices where the highest field in the semiconductor is relatively low. However, in SiC devices the electric fields in the blocking state may be very high (~2 MV/cm) which multiplies by a factor of 2.5 at the oxide-semiconductor interface. This leads to very high oxide fields and may result in long-term reliability problems. Thus, field plate terminations may be unsuitable for use in SiC devices.

The use of multiple floating guard rings in addition to JTE has been proposed as a technique for reducing the sensitivity of the JTE to implant dose variation. See Kinoshita et al., "Guard Ring Assisted RESURF: A New Termination Structure Providing Stable and High Breakdown Voltage for SiC Power Devices," Tech. Digest of ISPSD '02, pp. 253-256. Kinoshita et al. reported that such techniques reduced the sensitivity to implant dose variation. However, the area utilized for termination was increased to almost three times the area of JTE alone as the guard rings are added to both the inner edge of the JTE and the outside of the JTE.

A conventional JTE-terminated Schottky diode is illustrated in FIG. 1. As shown therein, a Schottky diode 10 includes an n– drift layer 12 on an n+ substrate 14. FIG. 1 illustrates one half of a Schottky diode structure; the structure may include mirror image portions (not shown). An anode Schottky contact 23 is on the drift layer 12, and a cathode contact 25 is on the n+ substrate 14. A junction termination extension (JTE) region 20 including a plurality of JTE zones 20A, 20B, 20C is provided in the n– drift layer 12 adjacent to the Schottky contact 23. The JTE zones 20A, 20B, 20C are p-type regions that may have levels of charge that decrease outwardly in a stepwise fashion with distance from the Schottky junction. Although three JTE zones 20A, 20B, 20C are illustrated, more or fewer JTE zones may be provided.

The JTE zones 20A, 20B, 20C may be formed by successive implantation of ions into the n– drift layer 12. However, such implantation may require multiple mask and implantation steps, increasing the complexity and expense of production. This may be exacerbated as the number of JTE zones is increased. Furthermore, the stepwise doping gradient provided by such an approach may not provide an ideal termination.

Additional conventional terminations of SiC Schottky diodes are described in "Planar Terminations in 4H—SiC Schottky Diodes With Low Leakage And High Yields" by Singh et al., ISPSD '97, pp. 157 160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331 332. Additionally, other termination techniques are described in published PCT Application No. WO 97/08754 entitled "SiC Semiconductor Device Comprising A PN Junction With A Voltage Absorbing Edge."

Another type of junction termination is disclosed in U.S. Pat. No. 7,026,650, which is assigned to the assignee of the present invention, the disclosure of which is incorporated herein by reference as if set forth fully.

A junction barrier Schottky (JBS) diode with a guard ring termination is illustrated in FIGS. 2 and 3. FIG. 2 is a cross sectional illustration of a junction barrier Schottky diode 30 with a guard ring edge termination, while FIG. 3 is a plan view of the junction barrier Schottky diode 30 without the Schottky contact. It will be appreciated that the structure of a JBS diode is similar to that of a merged P-N junction Schottky (MPS) diode, although the operation of the devices is slightly different in forward conduction mode. References to JBS diode structures herein are intended to refer to similar MPS structures as well.

The device 30 includes a silicon carbide substrate 14. The substrate may be doped with dopants having a first conductivity type, and may have a polytype of 2H, 4H, 6H, 3C and/or 15R.

The device 30 includes a lightly doped drift layer 12 of the first conductivity type. A Schottky contact 34 forms a Schottky barrier junction with the drift layer 12. A cathode contact 46 is on the n-type substrate 14.

A guard ring structure is provided at and extending beneath the surface of the drift layer 12 adjacent the Schottky junction between the Schottky contact 34 and the drift layer 12. The guard ring structure includes a plurality of guard rings 38 of a second conductivity type that form concentric rings around the active region of the device (i.e., the region including the Schottky junction). The guard rings 38 may be formed, for example, by ion implantation. Guard ring formation is described in detail in U.S. Pat. No. 7,026,650 entitled "Multiple Floating Guard Ring Edge Termination for Silicon Carbide Devices" issued on Apr. 11, 2006 and U.S. Publication No. 2006/0118792 entitled "Edge Termination Structures For Silicon Carbide Devices And Methods Of Fabricating Silicon Carbide Devices Incorporating Same" published on Jun. 8, 2006, which are assigned to the assignee of the present invention and which are incorporated herein by reference.

Also included in the structure is a lightly doped region 36 of the second conductivity type that is provided between the guard rings 38 at the surface of the drift layer 12. The lightly doped region 36 may extend outside the outermost guard ring 38, and may be formed to a depth in the drift layer 12 that is less than the depth to which the guard rings extend. In some embodiments, the lightly doped region 36 may provide a surface charge compensation region as discussed, for example in the above referenced U.S. Pat. No. 7,026,650 and U.S. Publication No. 2006/0118792. In some other embodiments, the lightly doped region may provide a reduced surface field (RESURF) region at the surface of the drift layer, as discussed, for example, in U.S. Pat. No. 7,026,650 and U.S. Publication No. 2006/0118792. The lightly doped region 36 may extend completely or incompletely between adjacent guard rings 38. Furthermore, the lightly doped region 36 may extend deeper or shallower into the drift layer 12 than the guard rings 38.

The device 30 further includes a plurality of junction barrier regions 42 of the second conductivity type at the surface of the drift layer 12 opposite the substrate 14. The junction barrier regions 42 may also be formed by ion implantation. In some embodiments, the junction barrier regions 42 may have a structure as shown in U.S. Publication No. 2006/0255423, which is assigned to the assignee of the present invention, and the disclosure of which is incorporated herein by reference.

The Schottky diode may also have a structure as shown in U.S. Publication No., 2009/0289262, U.S. Publication No 2008/0029838, U.S. Pat. No. 7,728,402 and/or U.S. Publication No. 2009/0289262, which are assigned to the assignee of the present invention, and the disclosures of which are incorporated herein by reference.

The Schottky contact 34 contacts the junction barrier regions 42. When a reverse bias is applied to the device, a depletion region generated at the p-n junction between the junction barrier regions 42 and the drift layer 12 sustains the reverse bias and thereby protects the Schottky junction.

Semiconductor power devices are designed to block (in the reverse blocking state) or pass (in the forward operating state) large levels of voltage and/or current. For example, in the reverse blocking state, a semiconductor power device may be designed to sustain hundreds to thousands of volts of electric potential. However, at high reverse voltages, a semiconductor power device may begin to let some current flow through the device. Such current, described as "leakage current" may be highly undesirable. Leakage current may begin to flow if the reverse voltage is increased beyond the design voltage blocking capability of the device, which is typically a function of the doping and thickness of the drift layer. However, leakage can occur for other reasons, such as failure of the edge termination and/or the primary junction of the device.

SUMMARY

An electronic device according to some embodiments includes a drift region, a Schottky contact on a surface of the drift region, and an edge termination in the drift region adjacent the Schottky contact. The edge termination includes a recessed region that is recessed from the surface of the drift region by a distance d and an edge termination structure in the recessed region.

The electronic device may further include a plurality of doped regions at the surface of the drift region and in contact with the Schottky contact, the drift region has a first conductivity type and the plurality of doped regions have a second conductivity type that is opposite the first conductivity type. The distance d may be about 0.2 microns to about 1 micron. In some embodiments, the distance d may be about 0.4 microns to about 0.8 microns, and in some embodiments, the distance d may be about 0.5 microns.

The edge termination structure may include a guard ring at a surface of the recessed region. The edge termination structure may further include a lightly doped region at a surface of the recessed region. The lightly doped region and the guard ring termination structure may have a second conductivity that is opposite a first conductivity of the drift region.

The electronic device may further include a sidewall in the drift region between the active region and the recessed region, and the guard ring may be located at a base of the sidewall adjacent the Schottky contact.

The distance d may be greater than a depth of the junction barrier Schottky regions from the surface of the drift region into the drift region.

The drift region may include silicon carbide. In particular embodiments, the drift region may include silicon carbide having a polytype of 2H, 4H, 6H, 3C, and/or 15R.

An electronic device according to some embodiments has an avalanche rating in excess of 780 mJ/cm². Avalanche rating may be defined as $V_{BR} \times I_R \times t_{pulse}$/active region area, wherein $V_{BR}$ is the breakdown voltage of the device, $I_R$ is the reverse current rating of the device and $t_{pulse}$ is a minimum duration of a current pulse that results in device failure. In some embodiments, the avalanche rating may be greater than 1000 mJ/cm². In further embodiments, the avalanche rating may be greater than 1200 mJ/cm². In still further embodiments, the avalanche rating may be greater than 1500 mJ/cm².

An electronic device according to some embodiments has a leakage voltage that is less than 100 V less than a theoretical avalanche breakdown voltage, wherein the leakage voltage is defined as a reverse voltage on the device that results in a leakage current of at least 100 µA/cm². In some embodiments, the electronic device may have a leakage voltage that is less than 25 V less than the theoretical avalanche breakdown voltage of the device.

An electronic device according to some embodiments includes a drift region having a first conductivity type, an active region including a first region at a surface of the drift region having a second conductivity type opposite the first conductivity type, a p-n junction between the active region and the first region is configured to sustain a voltage when the electronic device is reverse biased, and an edge termination in the drift region adjacent the active region. The edge termination includes a recessed region that is recessed from the surface of the drift region by a distance d and an edge termination structure in the recessed region. The edge termination structure may include a guard ring.

The edge termination structure may include a lightly doped region at a surface of the recessed region, the lightly doped region and the guard ring have a second conductivity that is opposite a first conductivity of the drift region.

The electronic device may have a leakage voltage that is less than 25 V less than a theoretical avalanche breakdown voltage of the device.

The electronic device may include a MOSFET, and the plurality of doped regions may include wells that define unit cells of the device.

The electronic device may include a Schottky diode, and the plurality of doped regions may include junction barrier regions that are configured to sustain a voltage when a reverse bias is applied to the device.

A Schottky diode according to some embodiments includes a silicon carbide drift region, a Schottky contact on the silicon carbide drift region, and an edge termination structure in the silicon carbide drift region surrounding the Schottky contact. The edge termination structure is configured to experience avalanche breakdown before a reverse breakdown of the Schottky contact when a reverse bias is applied to the device.

Methods of forming a semiconductor device according to some embodiments include providing a semiconductor layer, providing a recessed region in the semiconductor layer that defines a mesa in the semiconductor layer, the mesa including a horizontal mesa surface that is vertically offset from a floor of the recessed region, providing a junction termination structure in the recessed region, and providing a metal contact on the mesa surface.

Providing the junction termination structure may include implanting dopant ions into the recessed region of the semiconductor layer to form a surface charge compensation region at a surface of the recessed region of the semiconductor layer.

Providing the junction termination structure may include forming guard rings in the recessed region of the semiconductor layer, wherein the guard rings have a dopant concentration that is higher than a dopant concentration of the surface charge compensation region.

The methods may further include providing a plurality of junction barrier regions in the drift layer adjacent the mesa surface before providing the metal contact on the mesa surface.

The mesa floor may be vertically spaced from the mesa surface by a distance of about 0.5 microns.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As is described in more detail below, embodiments of the present invention may provide improved edge terminations for semiconductor devices, such as Schottky diodes, junction barrier Schottky (JBS) diodes, merged P-N Schottky (MPS) diodes, MOSFETs, insulated gate bipolar devices (IGBTs), MOS controlled thyristors, and other such semiconductor devices. Particular embodiments of the present invention provide edge termination structures for silicon carbide (SiC) devices. For example, embodiments of the present invention may be utilized as edge terminations for SiC Schottky diodes, JBS diodes, MPS diodes, MOSFETSs, IGBTs, MOS controlled thyristors, and other such SiC devices.

Figure 4:
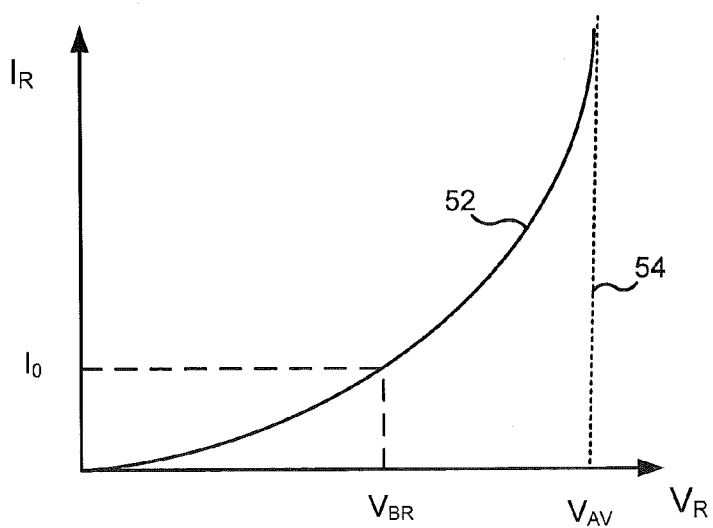
FIG. 4 is an exemplary graph of reverse current versus reverse voltage for a typical Schottky diode.

Exemplary leakage current characteristics for a JBS Schottky diode are shown in FIG. 4. In particular FIG. 4 is an exemplary curve 52 of reverse leakage current ($I_R$) versus reverse voltage ($V_R$) for a typical Schottky diode. In the graph of FIG. 4, the reverse leakage current $I_R$ increases with increasing reverse voltage. The reverse voltage at which the reverse leakage current reaches a predetermined level $I_0$ is defined as the rated breakdown voltage of the device.

As the reverse voltage on the diode is increased to a critical level, namely, the theoretical avalanche breakdown point ($V_{AV}$), the increasing electric field begins to ionize atoms within the semiconductor device itself, leading to avalanche breakdown. When avalanche breakdown occurs, the reverse current increases sharply. An exemplary curve showing reverse current characteristics due to avalanche breakdown is shown at curve 54.

In some applications, it is desirable for the device to be designed to survive an avalanche breakdown in case an excess reverse current or voltage is applied to the device. For the device to be able to survive an avalanche breakdown, it is desirable for the avalanche breakdown to occur in a uniform manner, rather than at localized areas of the device. If breakdown occurs in localized areas, the current through the device may become highly non-uniform, resulting in the formation of "hot spots" that can overheat and destroy the device.

Avalanche breakdown characteristics are desirable so that a device can be operated near its maximum electric field. It is also desirable for the device to have as low a leakage current and as high a rated breakdown voltage ($V_{BR}$) as possible. Some embodiments provide high power devices that have low leakage current and/or more uniform avalanche breakdown characteristics.

Figure 3:
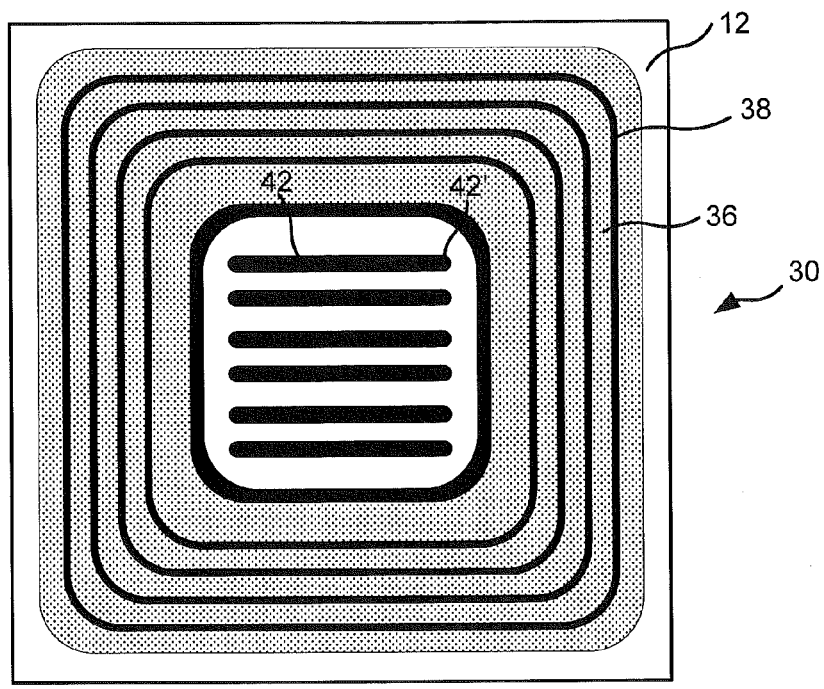
FIG. 3 is a plan view of the junction barrier Schottky diode of FIG. 2 without the Schottky contact.

The active region of a conventional power semiconductor device may begin to break down and allow leakage current to flow at a voltage that is lower than the design breakdown voltage of the device. In a JBS device, leakage current may also begin to flow at high field regions of the device, such as near the ends 42' of the JBS regions 42 shown in FIG. 3, and/or in an outer region of the Schottky contact nearest the edge of the device, where high electric fields may be experienced.

Figure 5A:
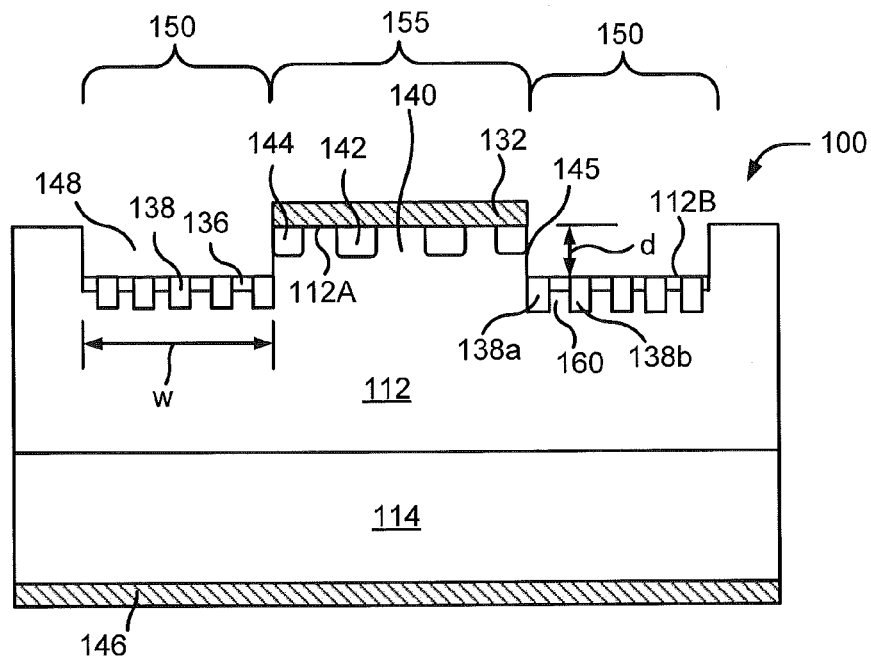
FIGS. 5A and 5B are cross sectional views of junction barrier Schottky diodes including a recessed guard ring edge terminations in accordance with some embodiments.
Figure 5B:
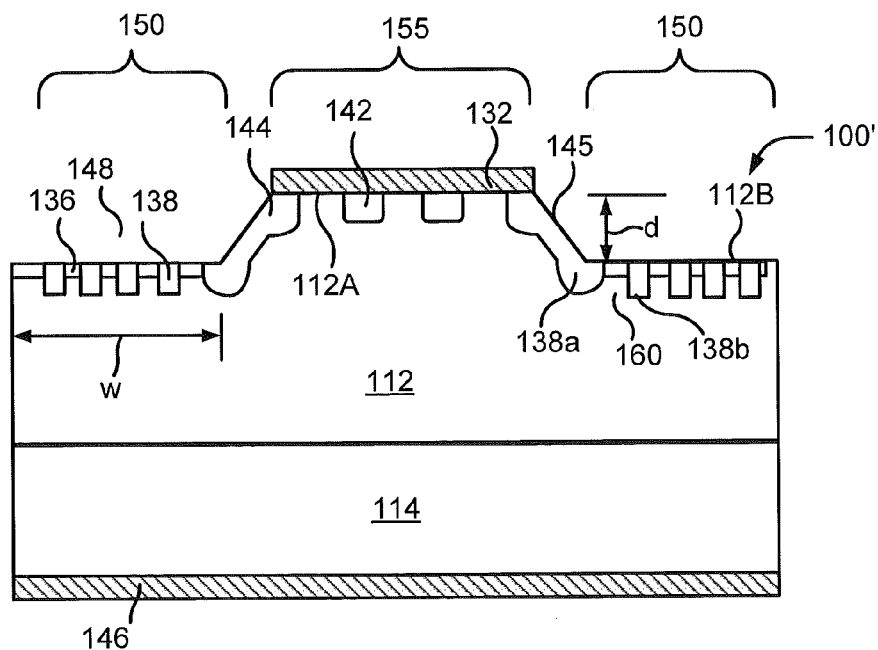

A junction barrier Schottky (JBS) diode with a recessed guard ring termination in accordance with some embodiments is illustrated in FIGS. 5A and 5B, which are cross sectional illustrations of a junction barrier Schottky diode 100 and a junction barrier Schottky diode 100', respectively, according to some embodiments.

Referring to FIG. 5A, the device 100 includes a substrate 114. The substrate may be silicon carbide doped with dopants having a first conductivity type, and may have a polytype of 2H, 4H, 6H, 3C and/or 15R. In some embodiments, the substrate 114 may include silicon, Group III-nitrides, such as gallium nitride and alloys thereof, Group III-arsenides, such as gallium arsenide and alloys thereof, diamond, or any other type of semiconductor material.

The device 100 includes a lightly doped drift layer 112 of the first conductivity type. A Schottky contact 132 forms a Schottky barrier junction with the drift layer 112. A cathode contact 146 is on the n-type substrate 114.

The device 100 further includes a plurality of junction barrier regions 142 of the second conductivity type at the surface of the drift layer 112 beneath the Schottky contact 132. The junction barrier regions 142 may also be formed by ion implantation. In some embodiments, the junction barrier regions 142 may have a structure as shown in U.S. Publication No. 2006/0255423, the disclosure of which is incorporated herein by reference.

The Schottky diode may also have a structure as shown in U.S. Publication No., 2009/0289262, U.S. Publication No. 2008/0029838; and/or U.S. Pat. No. 7,728,402, the disclosures of which are incorporated herein by reference.

The Schottky contact 132 contacts the junction barrier regions 142. When a reverse bias is applied to the device, a depletion region generated at the p-n junction between the junction barrier regions 142 and the drift layer 112 sustains the reverse bias and thereby protects the Schottky junction.

A recessed edge termination structure 150 is provided on the surface of the drift layer 112 adjacent an active region 155 that includes a Schottky junction between the Schottky contact 132 and the drift layer 112. The edge termination structure 150 may include a recessed guard ring structure that is formed in a recessed region 148 of the drift layer 112 adjacent the Schottky junction. The recessed region 148 may be formed, for example, by selectively etching the drift layer. Techniques for etching silicon carbide are well known in the art. In some embodiments, the recessed edge termination structure may include another type of termination structure, such as a junction termination extension (JTE) edge termination structure. Accordingly, it will be appreciated that embodiments of the invention are not limited to guard ring termination structures.

The recessed region 148 may be recessed from the top surface 112A of the drift layer 112 by a distance d that may be from about 0.2 microns to about 1 micron. In some embodiments, the recessed region 148 may be recessed from the top surface 112A by a distance d that may be about 0.3 microns to about 1 micron. In some embodiments, the recessed region 148 may be recessed from the top surface 112A by a distance d that may be about 0.4 microns to about 0.8 microns. In some embodiments, the recessed region 148 may be recessed from the top surface 112A by a distance d that may be about 0.5 microns.

The recessed region 148 of the drift layer 112 may have a width w that is based on the number of guard rings that are used. In some embodiments, the recessed portion 150 of the drift layer 112 may have a width w of about 15 microns to about 1000 microns.

The recessed guard ring structure 150 includes a plurality of guard rings 138 of a second conductivity type that form concentric rings (which need not be circular) around the active region 155 of the device (i.e., the region including the Schottky junction). The guard rings 138 may be formed, for example, by ion implantation. Guard ring formation is described in detail in U.S. Pat. No. 7,026,650 entitled "Multiple Floating Guard Ring Edge Termination for Silicon Carbide Devices" issued on Apr. 11, 2006 and U.S. Publication No. 2006/0118792 entitled "Edge Termination Structures For Silicon Carbide Devices And Methods Of Fabricating Silicon Carbide Devices Incorporating Same" published on Jun. 8, 2006, which are assigned to the assignee of the present invention and which are incorporated herein by reference.

In particular embodiments, the guard rings 138 may be formed to a depth below the recessed surface 112B of the drift layer 112 of about 0.3 microns and may have a doping concentration that is greater than about $1E18$ cm$^{-3}$.

The guard rings may include a first guard ring 138a at the base of the recessed region adjacent a sidewall 145 that separates the active region 155 and the recessed region 148. That is, the first guard ring 138a may be formed to overlap an inner corner of the recessed region 148 adjacent a sidewall 145 of a Schottky mesa 140 defined by the recessed region 148.

Also included in the structure is a lightly doped region 136 of the second conductivity type that is provided between the guard rings 138 at the surface of the drift layer 112. The lightly doped region 136 may extend outside the outermost guard ring 138, and may be formed to a depth in the drift layer 112 that is less than the depth to which the guard rings extend. In some embodiments, the lightly doped region 136 may provide a surface charge compensation region as discussed, for example in the above referenced U.S. Pat. No. 7,026,650 and U.S. Publication No. 2006/0118792. In some other embodiments, the lightly doped region may provide a reduced surface field (RESURF) region at the surface of the draft layer, as discussed, for example, in U.S. Pat. No. 7,026,650 and U.S. Publication No. 2006/0118792. The lightly doped region 136 may extend completely or incompletely between adjacent guard rings 138. Furthermore, the lightly doped region 136 may extend deeper or shallower into the drift layer 112 than the guard rings 138.

In particular embodiments, the lightly doped region 136 may be implanted to a depth of about 0.2 microns below the recessed surface 112B of the drift layer 112 and may have a doping concentration of about $1E17$ cm$^{-3}$.

FIG. 5B illustrates embodiments of a device 100' in which the sidewalls of the Schottky mesa 140 are slanted, and the guard ring 144 on the Schottky mesa 140 is merged with the first guard ring 138a in the recessed region 150 of the device.

Providing the guard ring structure 150 in a recessed region 148 of the drift layer may decrease reverse leakage current while at the same time making avalanche breakdown more uniform and/or consistent in the device, as illustrated, for example, in FIGS. 6-9, discussed in more detail below.

While not wishing to be bound by a particular theory, it is presently believed that recessing the guard ring region provides additional shielding for the end portions 42' of the Schottky barrier near the JBS regions 142, thus reducing leakage current that is caused by high electric fields near those end portions.

Furthermore, it is also presently believed that recessing the guard ring structure provides a structure that is more susceptible to controlled avalanche breakdown, particularly near a gap 160 between the two guard rings 138a, 138b that are closest to the primary junction. Thus, when the device reaches its breakdown voltage, avalanche breakdown may occur in a more controlled and/or uniform manner Uniform avalanche breakdown is less likely to result in the formation of hot spots in the device, and is therefore also less likely to lead to catastrophic failure of the device.

Figure 6:
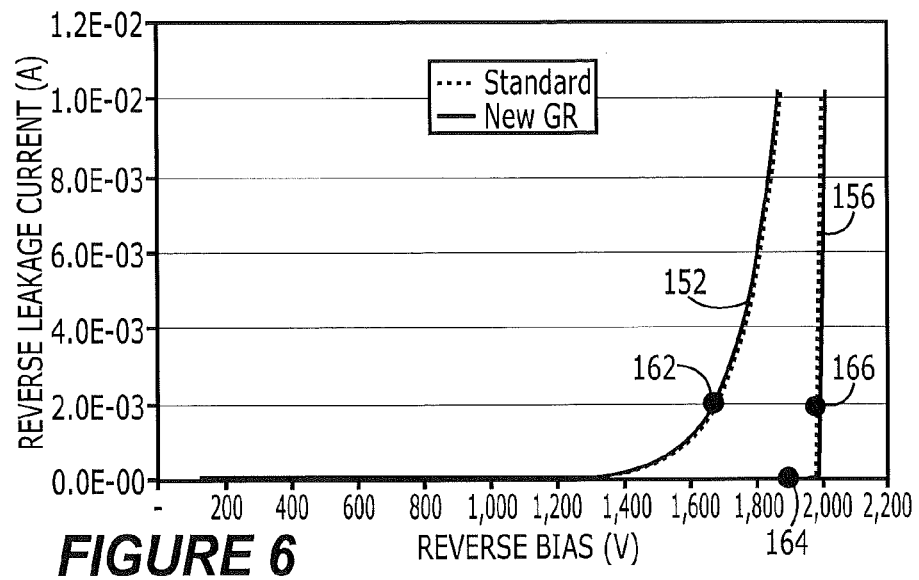
FIG. 6 is an exemplary graph of reverse current versus reverse voltage for a Schottky diode in accordance with some embodiments.

Measured leakage current characteristics for a conventional JBS Schottky diode and a JBS Schottky diode according to some embodiments are shown in FIG. 6. In particular FIG. 6 shows a curve 152 of reverse leakage current ($I_R$) versus reverse voltage ($V_R$) for a typical Schottky diode and a curve 156 of reverse leakage current ($I_R$) versus reverse voltage ($V_R$) for a JBS Schottky diode in accordance with some embodiments. Both the Schottky diodes illustrated in FIG. 6 had active regions having an area of 0.31 cm×0.31 cm, or 0.0961 cm$^2$. As shown in FIG. 6, the current-voltage curve 156 of the JBS Schottky diode according to embodiments of the invention may show less leakage current than a conventional JBS Schottky diode, and may have avalanche breakdown characteristics that more closely follow the ideal characteristics of low leakage current up to a point at which reverse current increases sharply due to avalanche breakdown.

In particular, as shown in FIG. 6, a device according to some embodiments may have a much higher rated breakdown voltage (point 166) at a predefined reverse current of 2 mA compared to a rated breakdown voltage (point 162) for a conventional JBS Schottky diode. For the device whose characteristics are illustrated at curve 156 in FIG. 6, the theoretical breakdown voltage is about 2000 V. As can be seen from FIG. 6, the reverse voltage on the device of curve 156 at the predefined reverse current level of 2 mA is much closer to the theoretical breakdown voltage of the device than the conventional device illustrated at curve 152.

In particular, a device according to some embodiments may have a voltage at a predefined reverse current of 20 mA/cm$^2$ that is less than about 100 V from the theoretical breakdown voltage of the device. In some embodiments, a device according to some embodiments may have a voltage at a predefined reverse current of 20 mA/cm$^2$ that is less than about 25 V from the theoretical breakdown voltage of the device.

A device according to further embodiments may have a voltage at a predefined reverse current of 100 mA/cm$^2$ that is less than about 100 V from the theoretical breakdown voltage of the device. In still further embodiments, a device according to some embodiments may have a voltage at a predefined reverse current of 100 mA/cm$^2$ that is less than about 25 V from the theoretical breakdown voltage of the device.

A Schottky device according to some embodiments may experience avalanche breakdown with a relatively low reverse leakage current occurring before the onset of breakdown, which may depend on the size of the device in question. For example, in some embodiments, a Schottky device may experience a reverse leakage current as low as 520 μA/cm$^2$ at a reverse voltage that is less than 100 V prior to the onset of breakdown. In further embodiments, a Schottky device may experience a reverse leakage current less than 0.5 mA/cm$^2$ at a reverse voltage that is less than 100 V prior to the onset of breakdown. In still further embodiments, a Schottky device may experience a reverse leakage current less than 10 mA/cm$^2$ at a reverse voltage that is less than 100 V prior to the onset of breakdown, and in still further embodiments, a Schottky device may experience a reverse leakage current less than 20 mA/cm$^2$ at a reverse voltage that is less than 100 V prior to the onset of breakdown.

Figure 1:
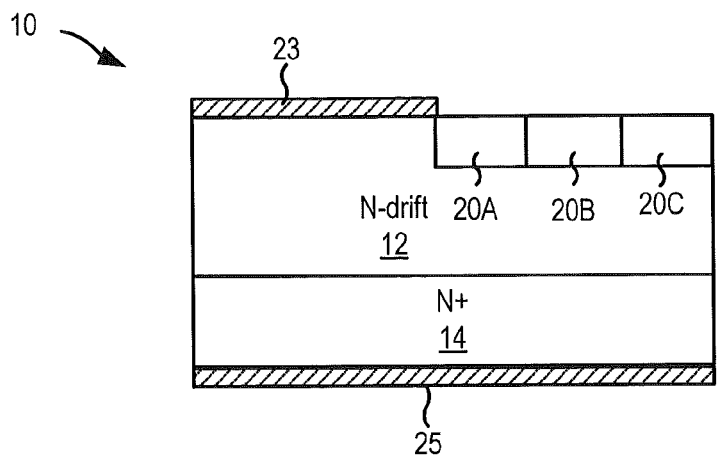
FIG. 1 illustrates a SiC Schottky diode with a conventional junction termination extension (JTE) termination.
Figure 2:
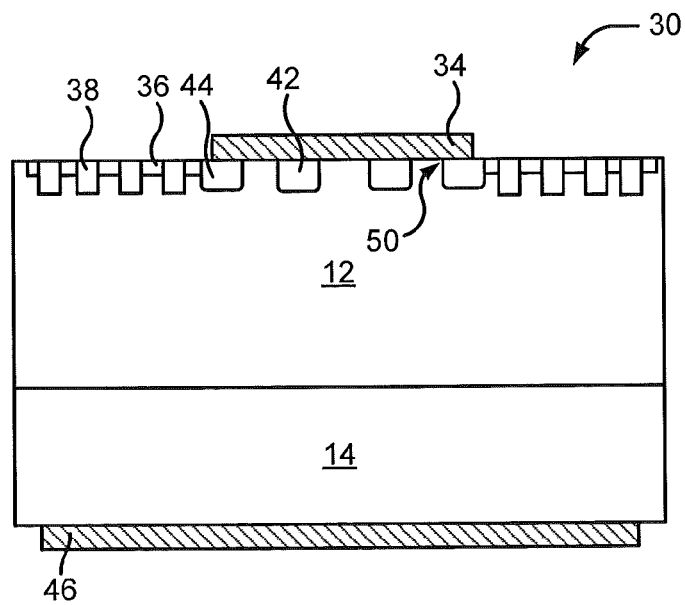
FIG. 2 is a cross sectional view of a junction barrier Schottky diode including a guard ring edge termination.
Figure 7:
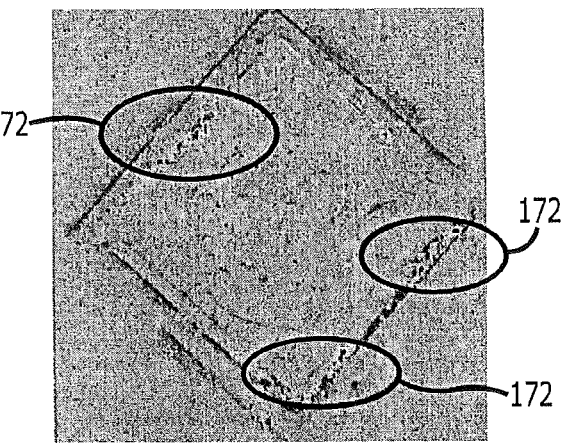
FIG. 7 is a thermal image of a conventional junction barrier Schottky diode exhibiting reverse breakdown around the periphery of the Schottky metal.

FIG. 7 is a thermal image of a conventional junction barrier Schottky diode exhibiting reverse breakdown around the periphery of the Schottky metal. In particular, the thermal image of FIG. 7 corresponds to a conventional JBS Schottky diode operated at the rated reverse breakdown current at point 162 in FIG. 6. The thermal image of FIG. 7 shows a number of "hot spots" 172 which indicate non-uniformly increased levels of current through the device. In particular, it appears that breakdown begins to occur at spots within the periphery of the Schottky metal near point 50 shown in FIG. 2, i.e., at the outermost point at which the Schottky metal 34 forms a Schottky junction to the drift region 12. This is an undesirable location for breakdown to occur in a Schottky device, because the Schottky junction may be sensitive to localized heating and/or high reverse currents. A breakdown at that location may be uncontrolled and may damage the device. In contrast, it is more desirable for breakdown to occur within the edge termination region of the device, which includes a more robust P-N junction.

Moreover, the heating pattern of FIG. 7 indicates that the Schottky junction of the device may be breaking down before a true avalanche breakdown condition is reached. In contrast, in a device according to some embodiments, avalanche breakdown may occur before the Schottky junction breaks down when a reverse bias is applied to the device.

Figure 8:
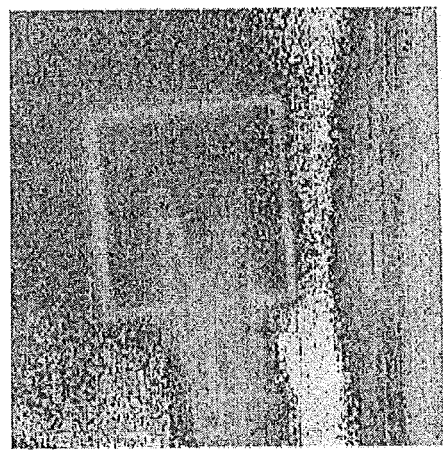
FIG. 8 is a thermal image of a junction barrier Schottky diode according to some embodiments exhibiting substantially uniform reverse leakage.

FIG. 8 is a thermal image of a junction barrier Schottky diode according to some embodiments exhibiting substantially uniform reverse leakage. In particular, the thermal image of FIG. 8 corresponds to a JBS Schottky diode according to some embodiments operated at point 164 in FIG. 6. Although the device is operated close to the breakdown voltage, the thermal image of FIG. 8 shows very uniform temperatures around the device.

Figure 9:
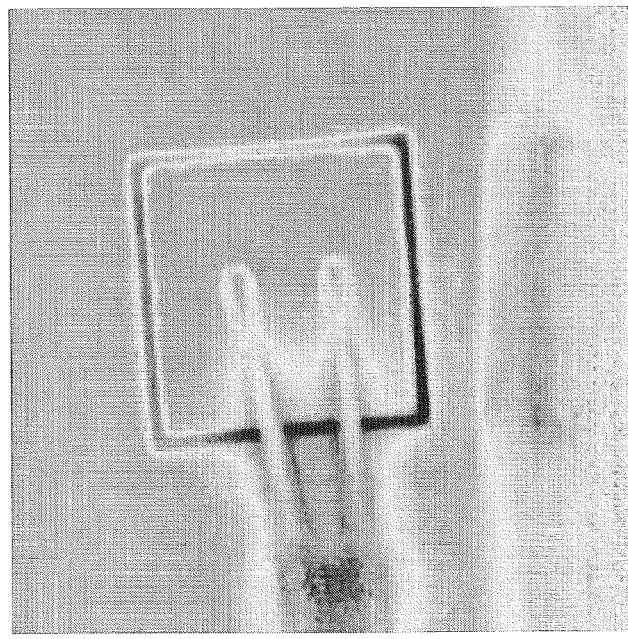
FIG. 9 is a thermal image of a junction barrier Schottky diode according to some embodiments exhibiting substantially uniform avalanche breakdown.

FIG. 9 is a thermal image of a junction barrier Schottky diode according to some embodiments exhibiting substantially uniform avalanche breakdown. In particular, the thermal image of FIG. 9 corresponds to a JBS Schottky diode according to some embodiments operated at the rated reverse breakdown current at point 166 in FIG. 6. The thermal image of FIG. 9 shows more uniform heating around the periphery of the device, and shows little localized heating of the device, indicating that avalanche breakdown may occur more uniformly in a device according to some embodiments. Moreover, the heating pattern of FIG. 9 indicates that avalanche breakdown may be desirably occurring in the edge termination region rather than at the Schottky junction.

Figure 10:
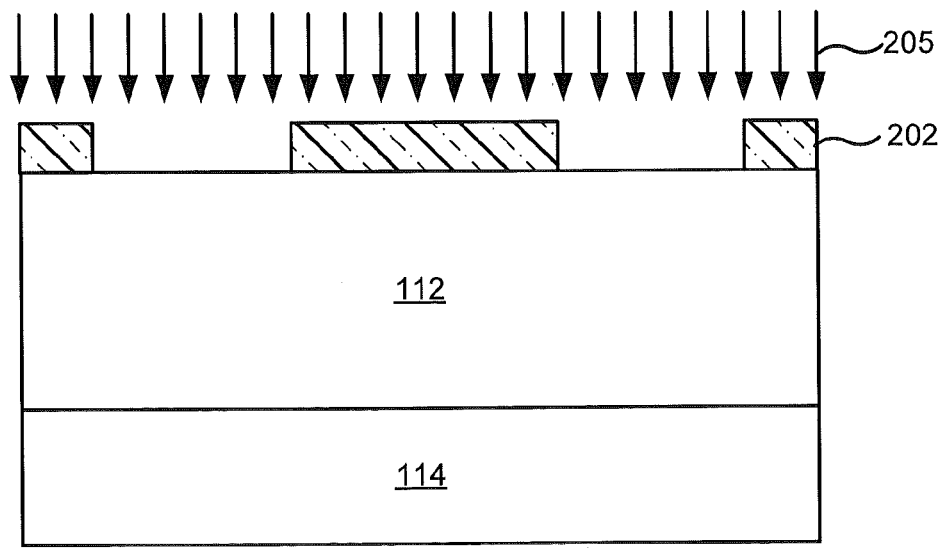
FIGS. 10-12 illustrate formation of a junction barrier Schottky diode in accordance with some embodiments.
Figure 11:
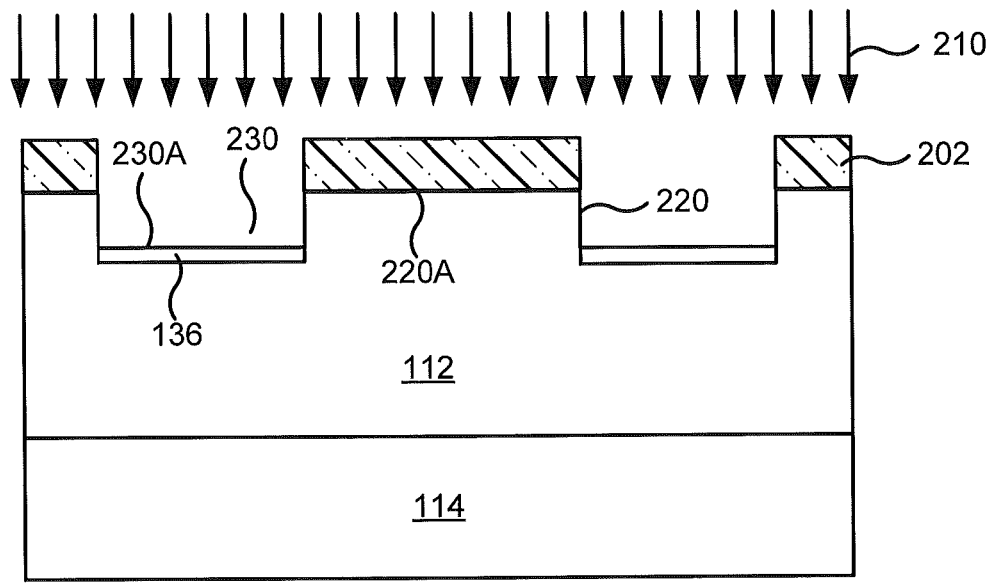
Figure 12:
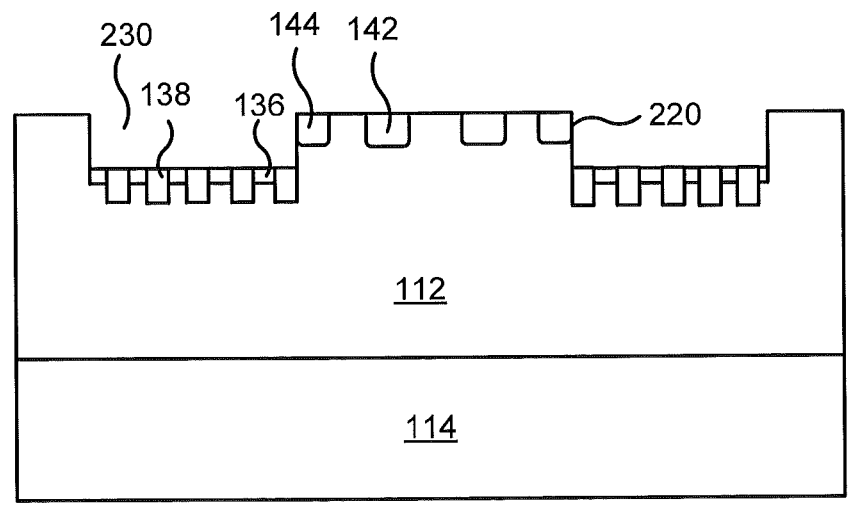

FIGS. 10-12 illustrate formation of a junction barrier Schottky diode in accordance with some embodiments. Referring to FIGS. 10-12, a semiconductor layer 112 is provided on a substrate 114. The semiconductor layer 112 and the substrate 114 may include silicon, silicon carbide, Group III-nitrides, such as gallium nitride and alloys thereof, Group III-arsenides, such as gallium arsenide and alloys thereof, diamond, or any other type of semiconductor material.

A mask 202 is formed on the semiconductor layer 112, and the semiconductor layer 112 is anisotropically etched, for example using reactive ions 205 to form a recessed region 230 in the semiconductor layer 112. The recessed region 230 includes a floor 230A that is generally parallel to a surface of the substrate 114 on which the semiconductor layer 112 is formed. The recessed region 230 also defines a mesa 220 in the semiconductor layer 112, the mesa 220 having a mesa surface 220A that is generally parallel to the floor 230A of the recessed region.

The floor 230A of the recessed region may be vertically offset from the mesa surface 220A by a distance of about 0.2 microns or more. In some embodiments, the floor 230A of the recessed region may be vertically offset from the mesa surface 220A by a distance of about 0.5 microns.

Using the same mask 202 or a different mask, dopant ions 210 may be selectively implanted into the semiconductor layer 112 through the floor 230A of the recessed region to form a lightly doped surface charge compensation region 136 as described in the above referenced U.S. Pat. No. 7,026,650. The surface charge compensation region 136 may have a conductivity type that is opposite the conductivity type of the semiconductor layer 112.

The mask 202 may then be removed, and one or more implant masks (not shown) may be used to form junction barrier regions 142 and/or a guard ring 144 in the mesa surface 220A and guard rings 138 in the recessed regions 230. The junction barrier regions 142 and/or the guard rings 144, 138, may have the same conductivity type as the surface charge compensation region 136 with a greater doping concentration than the surface charge compensation region 136.

A metal contact, such as a Schottky contact 132 (FIG. 5A) may be formed on the mesa surface, and a metal contact 146 (FIG. 5A) may be formed on an opposite side of the substrate 114.

Schottky devices according to some embodiments may have an avalanche rating in excess of 780 mJ/cm². In some embodiments, Schottky devices according to some embodiments may have an avalanche rating in excess of 1000 mJ/cm². In some embodiments, Schottky devices according to some embodiments may have an avalanche rating in excess of 1200 mJ/cm², and in further embodiments, Schottky devices according to some embodiments may have an avalanche rating of at least 1500 mJ/cm².

Avalanche rating is defined as follows:

$$\text{Avalanche rating} = V_{BR} \times I_R \times t_{pulse}/\text{chip area}$$

That is, the avalanche rating is equal to the breakdown voltage of the device ($V_{BR}$) multiplied by the reverse current rating of the device ($I_R$) multiplied by the minimum duration of a current pulse ($t_{pulse}$) that results in device failure and divided by the area of the active region of the device.

Although described primarily in connection with silicon carbide Schottky diodes, it will be appreciated that a recessed guard ring termination structure as described herein can be used in conjunction with many different kinds of devices and with many different kinds of material systems. As noted above, embodiments of the present invention may provide improved performance stability of semiconductor devices such as MOSFET and IGBTs. For example, embodiments of the present invention may be utilized as cell end protection at high electric fields on MOSFETs.

Figure 13:
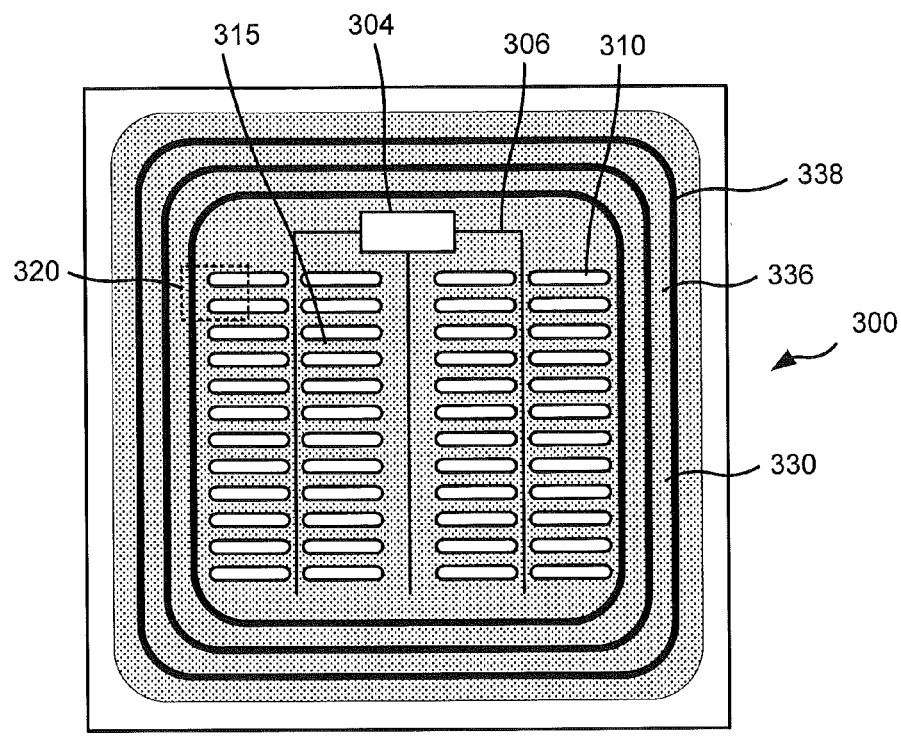
FIG. 13 is a plan view of a power MOSFET including a recessed edge termination region in accordance with some embodiments.

In particular, FIG. 13 is a plan view of a power MOSFET 300 including a recessed edge termination region 330 in accordance with some embodiments. The power MOSFET 300 includes a gate contact 304 and a plurality of gate bus lines 306 that run along a plurality of unit cells 310 in an active region 315 of the device. A recessed edge termination region 330 surrounds the active region 315. The edge termination region 330 may include a plurality of guard rings 338 and a surface charge compensation region 336. In some embodiments, the edge termination region 330 may include a junction termination extension (JTE) termination.

Figure 14A:
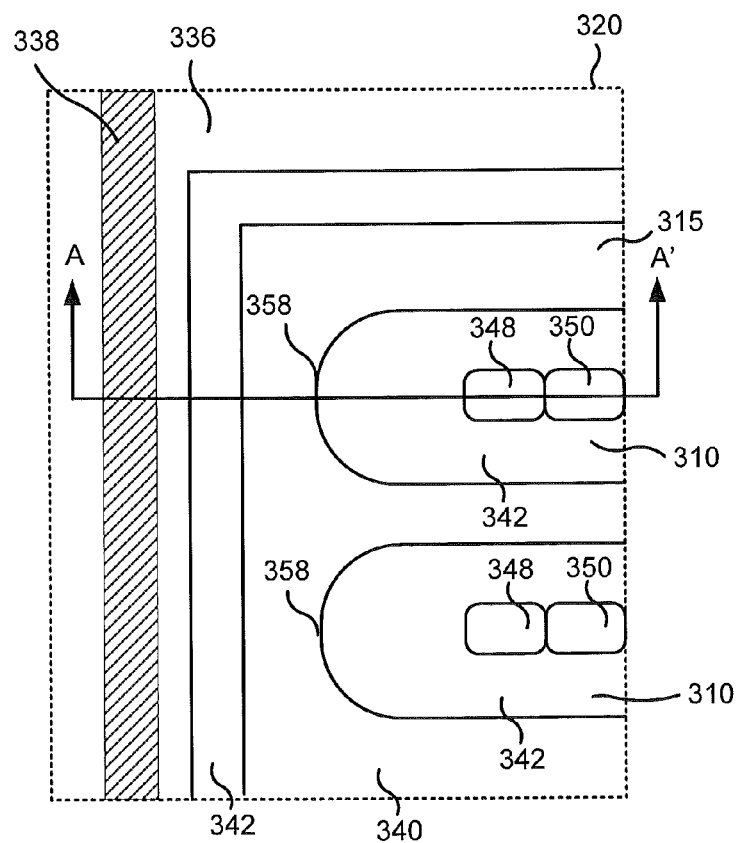
FIG. 14A is a detail view of a portion of a power MOSFET including a recessed edge termination region in accordance with some embodiments.
Figure 14B:
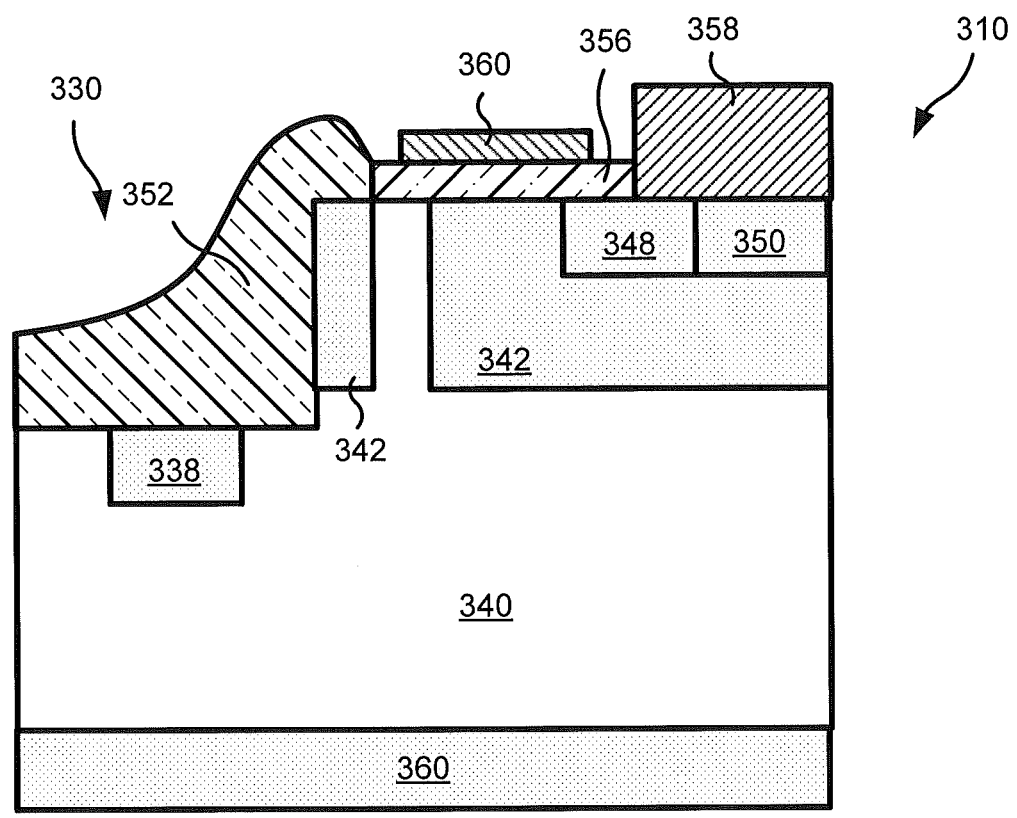
FIG. 14B is a cross section of a portion of a power MOSFET including a recessed edge termination region in accordance with some embodiments taken along line A-A' of FIG. 14A.

FIG. 14A is a detail view of a portion 320 of a power MOSFET 300 including a recessed edge termination region 330 in accordance with some embodiments, and FIG. 14B is a cross section of a portion of a power MOSFET 300 including a recessed edge termination region 330 in accordance with some embodiments taken along line A-A' of FIG. 14A.

Referring to FIGS. 14A and 14B, a unit cell 310 of the MOSFET 300 includes a p-well 342 formed in an n-type drift layer 340. An n+ source contact 348 and a p+ contact region 350 are provided in the p-well 342. (Conductivity types are shown as examples; a device according to some embodiments can have opposite conductivity types to those disclosed.) FIG. 14B shows additional details of the power MOSFET, including an oxide layer 356, a source contact 358, a field oxide 352 and a substrate 360.

A guard ring 338 is provided in a recessed edge termination region 330 adjacent the active region 315.

Referring to FIG. 14A, high electric fields may be present near endpoints 358 of the p-well regions 342 when a reverse bias is applied to the device. While not wishing to be bound by a particular theory, it is presently believed that providing a recessed edge termination region 330 adjacent the endpoints of the unit cells 310 may reduce the field at these endpoints 358, reducing the likelihood that the device will break down near these endpoints 358, and increasing the likelihood that avalanche breakdown will occur in the edge termination region before a breakdown occurs in the active region 315.

Figure 15A:
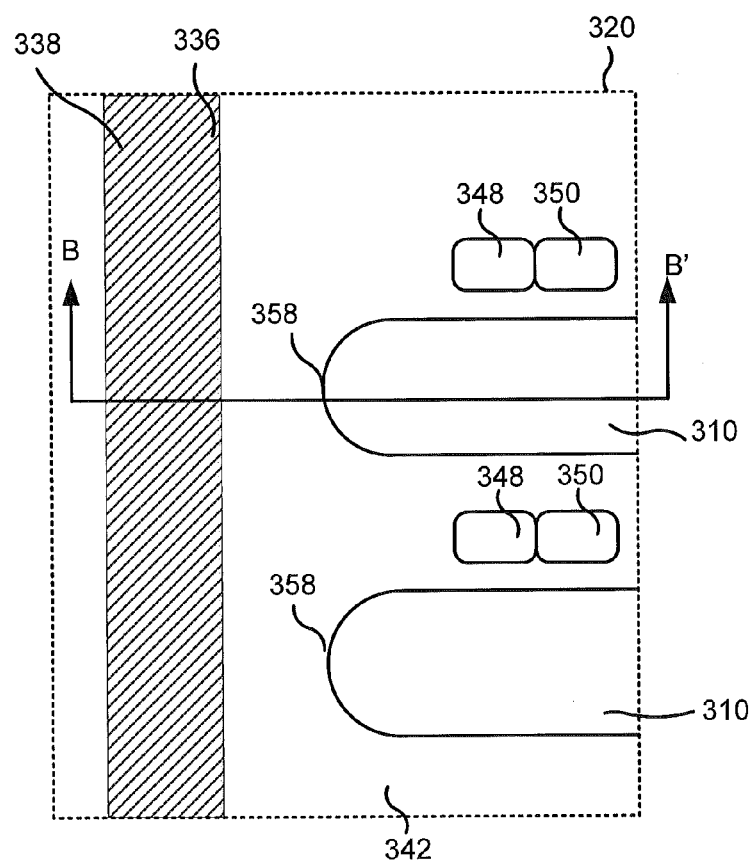
FIG. 15A is a detail view of a portion of a power MOSFET including a recessed edge termination region in accordance with further embodiments.
Figure 15B:
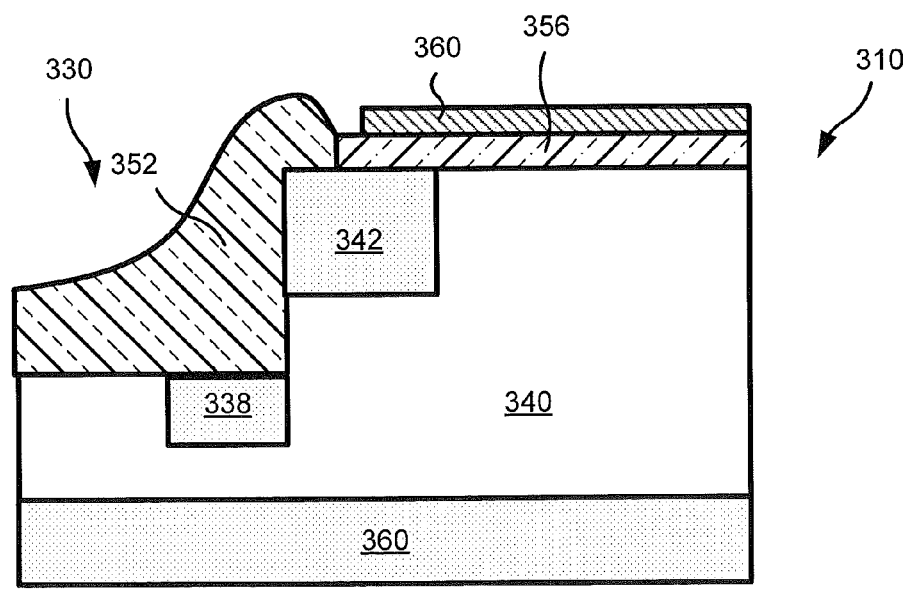
FIG. 15B is a cross section of a portion of a power MOSFET including a recessed edge termination region in accordance with further embodiments taken along line B-B' of FIG. 15A.

FIG. 15A is a detail view of a portion of a power MOSFET including a recessed edge termination region in accordance with further embodiments, and FIG. 15B is a cross section of a portion of a power MOSFET including a recessed edge termination region in accordance with further embodiments taken along line B-B' of FIG. 15A.

Referring to FIGS. 15A and 15B, a unit cell 310 of the MOSFET 300 includes a p-well 342 formed in an n-type drift layer 340. An n+ source contact 348 and a p+ contact region 350 are provided in the p-well 342. (Conductivity types are shown as examples; a device according to some embodiments can have opposite conductivity types to those disclosed.) FIG. 14B shows additional details of the power MOSFET, including an oxide layer 356, a field oxide 352 and a substrate 360.

A guard ring 338 is provided in a recessed edge termination region 330 adjacent the active region 315.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to herein as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention have been described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention have been described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electronic device, comprising:
a drift region;
a Schottky contact on a surface of the drift region;
an edge termination in the drift region adjacent the Schottky contact, wherein the edge termination comprises a recessed region that is recessed from the surface of the drift region by a distance d and an edge termination structure in the recessed region; and
an upper guard ring at the surface of the drift region beneath the Schottky contact and a plurality of lower guard rings at a surface of the recessed region, and wherein the upper guard ring and the plurality of lower guard rings have a second conductivity type that is opposite a first conductivity type of the drift region, wherein the lower guard rings comprise rings of the second conductivity type that are electrically isolated from one another and that surround an active region defined by the Schottky contact.

2. The electronic device of claim 1, farther comprising a plurality of junction barrier Schottky regions at the surface of the drift region and in contact with the Schottky contact, wherein the plurality of junction barrier Schottky regions have a second conductivity type that is opposite the first conductivity type.

3. The electronic device of claim 1, wherein the distance d is about 0.2 microns to about 1 micron.

4. The electronic device of claim 1, wherein the distance d is about 0.4 microns to about 0.8 microns.

5. The electronic device of claim 1, wherein the distance d is about 0.5 microns.

6. The electronic device of claim 1, further comprising a sidewall in the drift region between the active region and the recessed region, and wherein one of the plurality of lower guard rings is located at a base of the sidewall adjacent the Schottky contact.

7. The electronic device of claim 2, wherein the distance d is greater than a depth of the junction barrier Schottky regions from the surface of the drift region into the drift region.

8. The electronic device of claim 1, wherein the drift region comprises silicon carbide.

9. The electronic device of claim 8, wherein the drift region comprises silicon carbide having a polytype of 2H, 4H, 6H, 3C, and/or 15R.

10. The electronic device of claim 1, having an avalanche rating in excess of 780 mJ/cm$^2$, wherein avalanche rating is defined as $V_{BR} \times I_R \times t_{pulse}$/chip area, wherein $V_{BR}$ is the breakdown voltage of the device, $I_R$ is the reverse current rating of the device and $t_{pulse}$ is a minimum duration of a current pulse that results in device failure.

11. The electronic device of claim 10, wherein the avalanche rating is greater than 1000 mJ/cm$^2$.

12. The electronic device of claim 10, wherein the avalanche rating is greater than 1200 mJ/cm$^2$.

13. The electronic device of claim 10, wherein the avalanche rating is greater than 1500 mJ/cm$^2$.

14. The electronic device of claim 1, wherein the electronic device has a theoretical avalanche breakdown voltage based on a doping level and thickness of the drift region of the device, and having a leakage voltage that is less than 100 V less than the theoretical avalanche breakdown voltage, wherein the leakage voltage is defined as a reverse voltage on the device that results in a leakage current of at least 100 µA/cm$^2$.

15. The electronic device of claim 14, wherein, the electronic device has a leakage voltage that is less than 25 V less than the theoretical avalanche breakdown voltage of the device.

16. The electronic device of claim 1, wherein the edge termination structure is configured to experience avalanche breakdown before a reverse breakdown of the Schottky contact when a reverse bias is applied to the device.

17. The electronic device of claim 16, further comprising a junction barrier Schottky region in the drift region adjacent the Schottky contact.

18. The electronic device of claim 6, wherein the upper guard ring is merged with the one of the lower guard rings at the base of the sidewall.

19. The electronic device of claim 1, further comprising a lightly doped region having the second conductivity type at a surface of the recessed region, wherein the plurality of guard rings extend into the lightly doped region.

20. An electronic device, comprising:
a drift region having a first conductivity type;
an active region including a junction barrier Schottky region at a surface of the drift region having a second conductivity type opposite the first conductivity type wherein a p-n junction between the junction barrier Schottky region and the drift region is configured to sustain a voltage when the electronic device is reverse biased;
an edge termination in the drift region adjacent the active region, wherein the edge termination comprises a recessed region that is recessed from the surface of the drift region by a distance d and an edge termination structure in the recessed region; and
an upper guard ring in the active region at the surface of the drift region inside the edge termination;
wherein the edge termination structure comprises a plurality of guard rings at a surface of the recessed region, wherein the plurality of guard rings have a second conductivity type that is opposite a first conductivity type of the drift region and wherein the guard rings comprise rings of the second conductivity type that are electrically isolated from one another and that surround the active region; and
wherein the distance d is greater than a depth of the junction barrier Schottky region from the surface of the drift region into the drift region.

21. The electronic device of claim 20, wherein the device has a leakage voltage that is less than 25 V less than a theoretical avalanche breakdown voltage of the device, wherein the leakage voltage is defined as a reverse voltage on the device that results in a leakage current of at least 100 µA/cm$^2$.

22. The electronic device of claim 20, wherein the electronic device comprises a MOSFET, and wherein the plurality of doped regions comprise wells that define unit cells of the device.

23. The electronic device of claim 20, wherein the electronic device comprises a Schottky diode, and wherein the active region comprises a plurality of junction barrier regions that are configured to sustain a voltage when a reverse bias is applied to the device.

* * * * *